United States Patent
Saeki et al.

(10) Patent No.: US 6,450,757 B1
(45) Date of Patent: Sep. 17, 2002

(54) CONVEYOR SYSTEM

(75) Inventors: Hiroaki Saeki, Shirane-Machi; Keisuke Kondoh, Kofu, both of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/856,097
(22) PCT Filed: Nov. 15, 1999
(86) PCT No.: PCT/JP99/06358
§ 371 (c)(1), (2), (4) Date: May 17, 2001
(87) PCT Pub. No.: WO00/29176
PCT Pub. Date: May 25, 2000

(30) Foreign Application Priority Data

Nov. 17, 1998 (JP) .......................................... 10-343585

(51) Int. Cl.⁷ ................................................ B25J 9/06
(52) U.S. Cl. ....................... 414/744.5; 414/917; 901/15
(58) Field of Search ............................. 414/744.5, 917; 901/15

(56) References Cited

U.S. PATENT DOCUMENTS

| 5,447,409 A | 9/1995 | Grunes et al. |
| 5,885,052 A | 3/1999 | Tsuji et al. |
| 6,068,704 A | 5/2000 | Saeki et al. |

FOREIGN PATENT DOCUMENTS

| JP | 5-129418 | 5/1993 |
| JP | 6-42602 | 2/1994 |
| JP | 8-71965 | 3/1996 |
| JP | 8-162516 | 6/1996 |
| JP | 9-283588 | 10/1997 |

OTHER PUBLICATIONS

English Abstract for Japanese Patent Laid–Open No. 162516/1996.
English Abstract for Japanese Patent Laid–Open No. 129418/1993.
English Abstract for Japanese Patent Laid–Open No. 71965/1996.
Copy of application Ser. No. 09/744,175, filed Jan. 19, 2001.
English Translation of PCT International Preliminary Examination Report for PCT/JP99/06358, dated Dec. 22, 2000.

*Primary Examiner*—Eileen D. Lillis
*Assistant Examiner*—Michael Lowe
(74) *Attorney, Agent, or Firm*—Smith, Gambrell & Russell, LLP

(57) ABSTRACT

In most cases, a hot, corrosive atmosphere is created in, for example, a semiconductor wafer processing chamber. When an arm including belts, such as steel belts, is moved into such a semiconductor wafer processing chamber, the belts are exposed to the hot, corrosive atmosphere. Belts, such as steel belts, have limited heat resistance and corrosion resistance and the hot, corrosive atmosphere in the processing chamber shortens the life of the belts. A carrying device of the present invention has a frog leg type arm (3) and a wafer holder (4) connected to the frog leg type arm (3). The wafer holder (4) is pivotally connected to front end parts of a first front arm (8A) and a second front arm (8B) by coaxial joints (10). The wafer holder (4) is linked to the first front arm (8A) and the second front arm (8B) by a posture maintaining linkage (5) including two antiparallel linkages capable of controlling the turning of the wafer holder (4) relative to the first and the second front arms (8A, 8B).

6 Claims, 12 Drawing Sheets

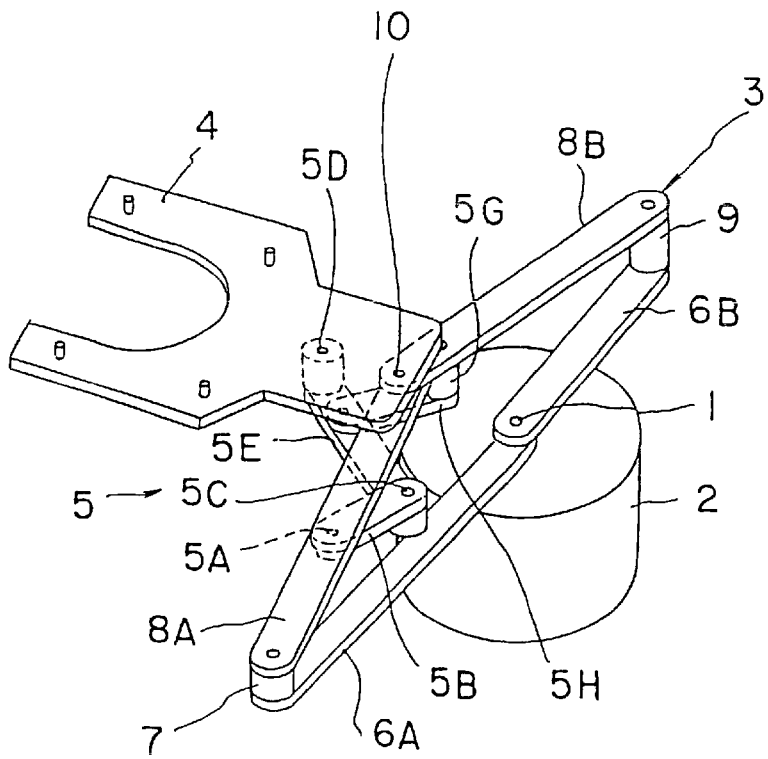
F I G. 1
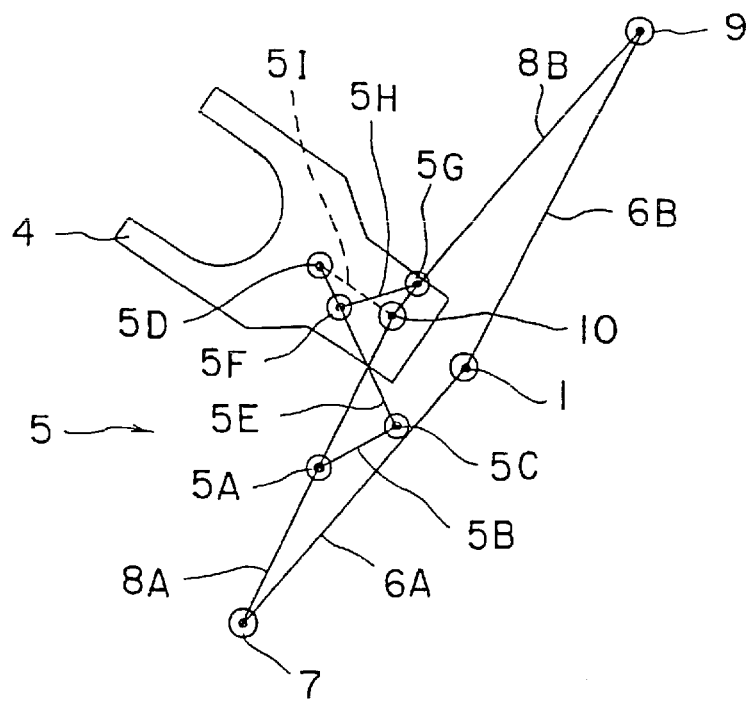
F I G. 2

CONVEYOR SYSTEM

TECHNICAL FIELD

The present invention relates to a carrying device employed in, for example, a semiconductor device fabricating system to carry semiconductor wafers, i.e., workpieces.

BACKGROUND ART

A conventional carrying device of this kind is used, for example, for carrying semiconductor wafers between a wafer storage chamber and a wafer processing chamber. Known carrying devices of this kind include those provided with a frog leg type arm and those provided with a parallel link type. A carrying device provided with a frog leg type arm has, for example, a pair of drive arms having base end parts connected to a drive shaft, a pair of front arms connected to front end parts of the drive arms by joints, respectively, and a wafer holder connected to front end parts of the front arms. For example, the front end parts of the pair of front arms are connected to the wafer holder by two rotating drums, i.e., upper and lower rotating drums. Two steel belts, i.e., upper and lower steel belts, are crossed around the upper and the lower drum, respectively, to turn the pair of front arms exactly synchronously through the same angle in the opposite directions, respectively. A gear mechanism is used instead of a position maintaining mechanism including rotating drums and steel belts. This position maintaining mechanism maintains the frog leg type arm in a symmetrical shape while the frog leg type arm is bent and stretched. The position maintaining mechanism is used as a power transmitting mechanism for the joint of a parallel link type arm.

In most cases, a hot, corrosive atmosphere is created in, for example, a semiconductor wafer processing chamber. When the arm including belts, such as steel belts, is moved into such a semiconductor wafer processing chamber, the belts are exposed to the hot, corrosive atmosphere. Belts, such as steel belts, have limited heat resistance and corrosion resistance and the hot, corrosive atmosphere in the processing chamber shortens the life of the belts. A carrying device employing gears is not subject to such problems that may be encountered by steel belts. However, gears are apt to produce dust and particles, and backlash between the mating gears causes problem in carrying accuracy.

DISCLOSURE OF THE INVENTION

The present invention has been made to solve the foregoing problems and it is therefore an object of the present invention to provide a carrying device not employing any transmission mechanism including belts and gears, excellent in heat resistance and corrosion resistance, and capable of accurately and surely carrying a workpiece, such as a semiconductor wafer, always in a stable position.

According to a first invention of the present application, a carrying device comprises a support member; first and second shafts supported on the support member; a frog leg type arm having a base end part connected to the first and the second shaft; and a holding member for holding a workpiece, connected to a front end part of the frog leg type arm; wherein the frog leg type arm comprises: a rotatable first drive arm having a base end part mounted on the first shaft, a rotatable second drive arm having a base end part mounted on the second shaft, a first front arm having a base end part pivotally connected to a front end part of the first drive arm by a first joint and a second front arm having a base end part pivotally connected to a front end part of the second drive arm by a second joint; the holding member is connected by third and fourth joints to front end parts of the first and the second front arm; the holding member is linked to the first and the second front arm by a posture maintaining linkage having two similar antiparallel linkages, and the posture maintaining linkage controls turning of the holding member relative to the first and the second front arm.

According to a second invention, in the carrying device according to the first invention, the first and the second shaft are coaxial, the third and the fourth joint are coaxial, the first and the second drive arm and the first and the second front arm have the same length, a parallel linkage is formed by connecting opposite end parts of a links disposed opposite to the first drive arms to the first front arm and the second drive arm, and the parallel linkage has an uncontrollable and unstable point at a position other than a position where the coaxial third and fourth joints overlap the coaxial first and the second shaft.

According to a third invention of the present application, a carrying device comprises: a support member; first and second shafts coaxially supported on the support member; a frog leg type arm having a base end part connected to the first and the second shaft; and a holding member for holding a workpiece, connected to a front end part of the frog leg type arm; wherein the frog leg type arm comprises: a rotatable first drive arm having a base end part mounted on the first shaft, a rotatable second drive arm having a base end part mounted on the second shaft, a front arm having a base end part pivotally connected by a first joint to a front end part of the first drive arm and two links extended in parallel to the first drive arm and having opposite end parts connected to the front arm and the second drive arm; the first and the second drive arm, the front arm and the two links have the same length, and the first and the second drive arm, the front arm and the two links form two parallel linkages; the two parallel linkages have different uncontrollable and unstable points, respectively, and the first and the second drive arm and the front arm form three sides of a rhombus; the holding member is pivotally connected to a front end part of the front arm by a second joint; and the front arm, a front end part of the second drive arm and the holding member are linked by a posture maintaining linkage having two similar antiparallel linkages, and the posture maintaining linkage controls the turning of the holding member relative to the front arm.

According to a fourth invention, in the carrying device in the second or the third invention, the holding member is provided with workpiece holding parts at its opposite ends, and a joint is disposed at a middle point between the holding parts.

According to a fifth invention of the present application, a carrying device comprises: a support member; a parallel linkage type arm having a base end part supported on the support member; and a holding member for holding a workpiece, connected to a front end part of the parallel linkage type arm; wherein the parallel linkage type arm comprises: a first link fixed to the support member, a rotatable drive arm having a base end part mounted on a drive shaft penetrating an end part of the first link, a driven arm having a base end part pivotally connected to the other end of the first link by a first joint, a second link pivotally connected to front end parts of the drive arm and the driven arm by second and third joints, respectively, and first and second front arms having base end parts pivotally connected to the second link; the holding member is connected pivotally to front end parts of the first and the second front arm by fourth and fifth joints; and the drive arm or the driven arm, the second link, and the first or the second front arm are linked by a posture maintaining linkage having two similar antiparallel linkages, and the posture maintaining linkage makes the holding member move along a straight line.

The carrying device according to the first or the fifth invention is provided with a frog leg type arm or a parallel linkage type arm not having a transmission mechanism including belts or gears, excellent in heat resistance and corrosion resistance, and capable of accurately and surely carrying a workpiece, such as a semiconductor wafer, always in a stable position.

According to the second or the fourth invention, the carrying device is provided with a frog leg type arm capable of carrying a workpiece optionally forward or backward relative to the support member in the first invention.

The carrying device according to the third invention is provided with the frog leg type arm capable of exercising the same functions and the same effect as those of the first invention and of carrying a workpiece through a narrow opening.

BRIEF DESCRIPTION OF THE DRAWINGS

FIG. 1 is a perspective view of a carrying device provided with a frog leg type arm in a first embodiment according to the present invention;

FIG. 2 is a diagrammatic view of assistance in explaining a linkage included in the carrying device shown in FIG. 1;

BEST MODE FOR CARRYING OUT THE INVENTION

Figure 3:
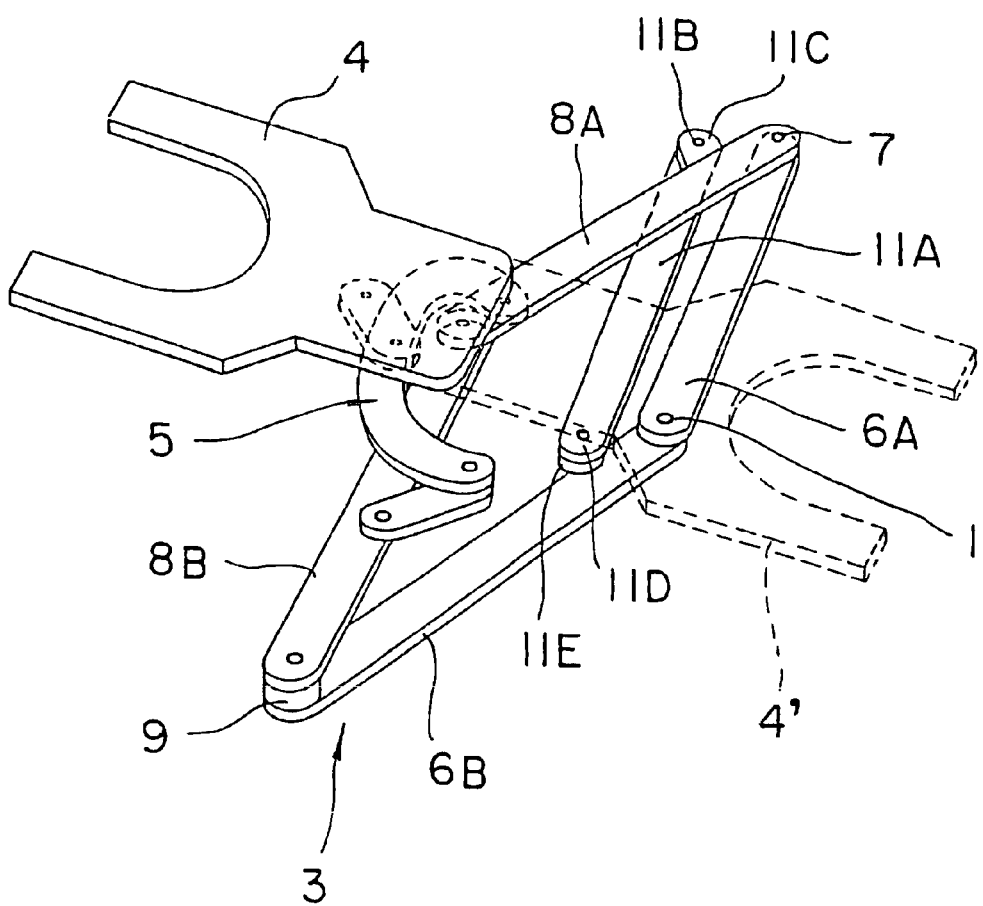
FIG. 3 is a perspective view of a carrying device provided with a frog leg type arm in a second embodiment according to the present invention.

Preferred embodiments of the present invention will be described with reference to FIGS. 1 to 17.

Referring to FIGS. 1 and 2, a carrying device in a first embodiment according to the present invention includes a drive shaft 1 formed by coaxially combining first and second drive shafts, not shown, a support member 2 supporting the drive shaft 1 in its central part and housing a driving device for driving the drive shaft 1, a frog leg type arm 3 having a base end part connected to the drive shaft 1 supported on the support member 2, a wafer holder 4 connected to a front end part of the frog leg type arm 3, and a posture maintaining linkage 5 for restricting the turning of the wafer holder 4 to maintain the wafer holder 4 always in a fixed posture. The first drive shaft of the drive shaft 1 is a hollow shaft and the second drive shaft is extended through the first drive shaft. The first and the second drive shaft are connected with a driving device and are driven for turning in the normal direction and the reverse direction (in the opposite directions), respectively. The frog leg type arm 3 is extended and contracted by turning the first and the second drive shaft through the same angle in the opposite directions, respectively. Turning of the first and the second drive shaft to a same direction by a same amount can change the carrying direction of the frog leg type arm 3. When the carrying device in this embodiment is applied to a multichamber processing system, wafers can be carried into and carried out of a plurality of processing chambers.

The frog leg type arm 3 has a first drive arm 6A having a base end part connected to the first drive shaft and capable of being turned in opposite directions, a second drive arm 6B having a base end part connected to the second drive shaft and capable of being turned in opposite directions, a first front arm 8A having a base end part pivotally connected to a front end part of the first drive arm 6A by a first joint 7 so as to be able to turn in opposite directions, and a second front arm 8B having a base end part pivotally connected to a front end part of the second drive arm 6B by a second joint 9 so as to be able to turn in opposite directions. The first front arm 8A and the second front arm 8B have front end parts pivotally connected to a middle part of a base end part of the wafer holder 4 by third and fourth joints 10 (hereinafter referred to simply as "joints 10"). Thus the first front arm 8A and the second front arm 8B are able to turn relative to the base end part of the wafer holder 4 in opposite directions. The first front arm 8A and the second front arm 8B are slightly longer than the first drive arm 6A and the second drive arm 6B. The wafer holder 4 is interlocked with the pair of the first front arm 8A and the second front arm 8B by the posture maintaining linkage 5.

Referring to FIG. 1, the posture maintaining linkage 5 includes a first link 5B having one end pivotally connected to a middle part of the first front arm 8A by a pivot 5A, a second link 5E having one end part pivotally connected to the other end of the first link 5B by a pivot 5C and the other end pivotally connected to the base end part of the wafer holder 4 by a pivot 5D disposed at a position on the front side of the joints 10 in the base end part of the wafer holder 4, and a third link 5H having one end pivotally connected to a part of the second link 5E near the pivot 5D by a pivot 5F and the other end pivotally connected to a part of the second front arm 8B near the front end of the same by a pivot 5G. As indicated by a broken line in FIG. 2, a part of the wafer holder 4 between the joint 10 and the pivot 5D serves as a fourth link 5I of the posture maintaining linkage 5.

FIG. 2 is a diagrammatic view of assistance in explaining the frog leg type arm 3 and the posture maintaining linkage 5 shown FIG. 1. The posture maintaining linkage 5 will be described with reference to FIG. 2. The first link 5B and the fourth link 5I have the same length and the length of the second link 5E is equal to the distance between the joint 10 and the pivot 5A. The pivots 5A, 5C and 5D and the joint 10 comprises a first antiparallel linkage. The third link 5H and the fourth link 5I have the same length, the length of a part of the second link 5E between the pivots 5D and 5F is equal to that of a part of the second front arm 8B between the pivot 5G and the joint 10. The pivots 5D, 5F and 5G and the joint 10 comprises a second antiparallel linkage. The ratio of the length of the second link 5E to that of the first link 5B is equal to the ratio of the length of the third link 5H to that of the part between the pivots 5D and 5F. Folding up a parallel linkage along a diagonal forms an antiparallel linkage.

In the first antiparallel linkage, the angle between the links extending from the pivot 5A is equal to that between the links extending from the pivot 5D, and the angle between the links extending from the pivot 5C is equal to that between the links extending from the joint 10. In the second antiparallel linkage, the angle between the links extending from the pivot 5D is equal to that between the links extending from the pivot 5G, and the angle between the links extending from the pivot 5F is equal to that between the links extending from the joint 10. Since the angle between the links extending from the pivot 5D of the first antiparallel linkage is equal to the angle between the links extending from the pivot 5D of the second antiparallel linkage, the first and the second antiparallel linkage are similar in shape and the corresponding angles between the corresponding link are always the same regardless of the position of the frog leg type arm 3. Thus, the angle between the links extending from the joint 10 of the first antiparallel linkage is always equal to that between the links joined on the joint 10 of the second antiparallel linkage. Therefore an extension of the fourth link 5I, i.e., a part of the wafer holder 4, always bisects the angle between the first front arm 8A and the second front arm 8B regardless of the position of the frog leg type arm 3. Thus the posture maintaining linkage 5 maintains the wafer holder 4 always in a symmetrical position on the front end part of the frog leg type arm 3, the wafer holder 4 can be moved straight as the frog leg type arm 3 is extended or contracted without deviation to carry a wafer accurately to a desired position.

FIG. 3 shows a carrying device in a second embodiment according to the present invention. In the second embodiment, a frog leg type arm 3 includes a first drive arm 6A, a second drive arm 6B, a first front arm 8A and a second front arm 8B, which are formed in the same length to give the frog leg type arm 3 a long stroke. The frog leg type arm 3 of the carrying device in the first embodiment is at the uncontrollable and unstable point when the frog leg type arm 3 is contracted such that the first drive arm 6A and the second drive arm 6B are in the same straight line on the support member 2 and the joint 10 joining the first front arm 8A and the second front arm 8B overlies the drive shaft 1. The joint 10 overlying the drive shaft 1 is able to move either forward or backward and is unrestrained. Consequently, the frog leg type arm 3 is unable to function. The frog leg type arm 3 of the second embodiment is provided with an uncontrollable and unstable point avoidance linkage 11 to avoid the uncontrollable and unstable point.

In FIG. 3 parts of the second embodiment like or corresponding to those of the first embodiment are denoted by the same reference characters. The carrying device in the second embodiment is the same as that in the first embodiment, except that the first drive arm 6A, the second drive arm 6B, the first front arm 8A and the second front arm 8B of the frog leg type arm 3 of the second embodiment have the same length and the frog leg type arm 3 of the second embodiment is provided with the uncontrollable and unstable point avoidance linkage 11. As shown in FIG. 3, the uncontrollable and unstable point avoidance linkage 11 of this embodiment is a parallel linkage including, for example, the first drive arm 6A, a link 11A extended in parallel to the first drive arm 6A, a projecting link 11C pivotally connected to one end part of the link 11A by a pivot 11B, laterally projecting from the first front arm 8A and interconnecting the pivot 11B and a first joint 7, and a projecting link 11E pivotally connected to the other end part of the link 11A by a pivot 11D, laterally projecting from the second drive arm 6B and connecting a drive shaft 1 and the pivot 11D. The length of the link 11A is equal to that of the first drive arm 6A, and the length of the projecting link 11C (the distance between the first joint 7 and the pivot 11B) is equal to that of the projecting link 11E (the distance between the drive shaft 1 and the pivot 11D). Thus the first front arm 8A and the second front arm 8B do not become unrestrained even if a joint 10 joining the first front arm 8A and the second front arm 8B overlies the drive shaft 1, the first drive arm 6A and the second drive arm 6B are in the same straight line and the first front arm 8A and the second front arm 8B are superposed on the first drive arm 6A and the second drive arm 6B because the frog leg type arm 3 is provided with the uncontrollable and unstable point avoidance linkage 11. Consequently, the frog leg type arm 3 can be smoothly extended either forward or backward according to the turning directions of the first drive arm 6A and the second drive arm 6B, so that a wafer holder 4 can be surely moved either forward or backward and the frog leg type arm 3 has a long stroke.

The wafer holder 4 indicated by continuous lines in FIG. 3 carries a single wafer. In the carrying device shown in FIG. 3 having the first front arm 8A and the second front arm 8B and not having any uncontrollable and unstable point, the wafer holder 4 is able to move in opposite directions with respect to a support member 2. Therefore, the carrying device in this embodiment may be provided with a wafer holder 4' having a shape formed by extending a wafer holder of the same shape as the wafer holder 4 from the base end of the wafer holder 4 as indicated by broken lines and capable of holding two wafers.

Figure 4:
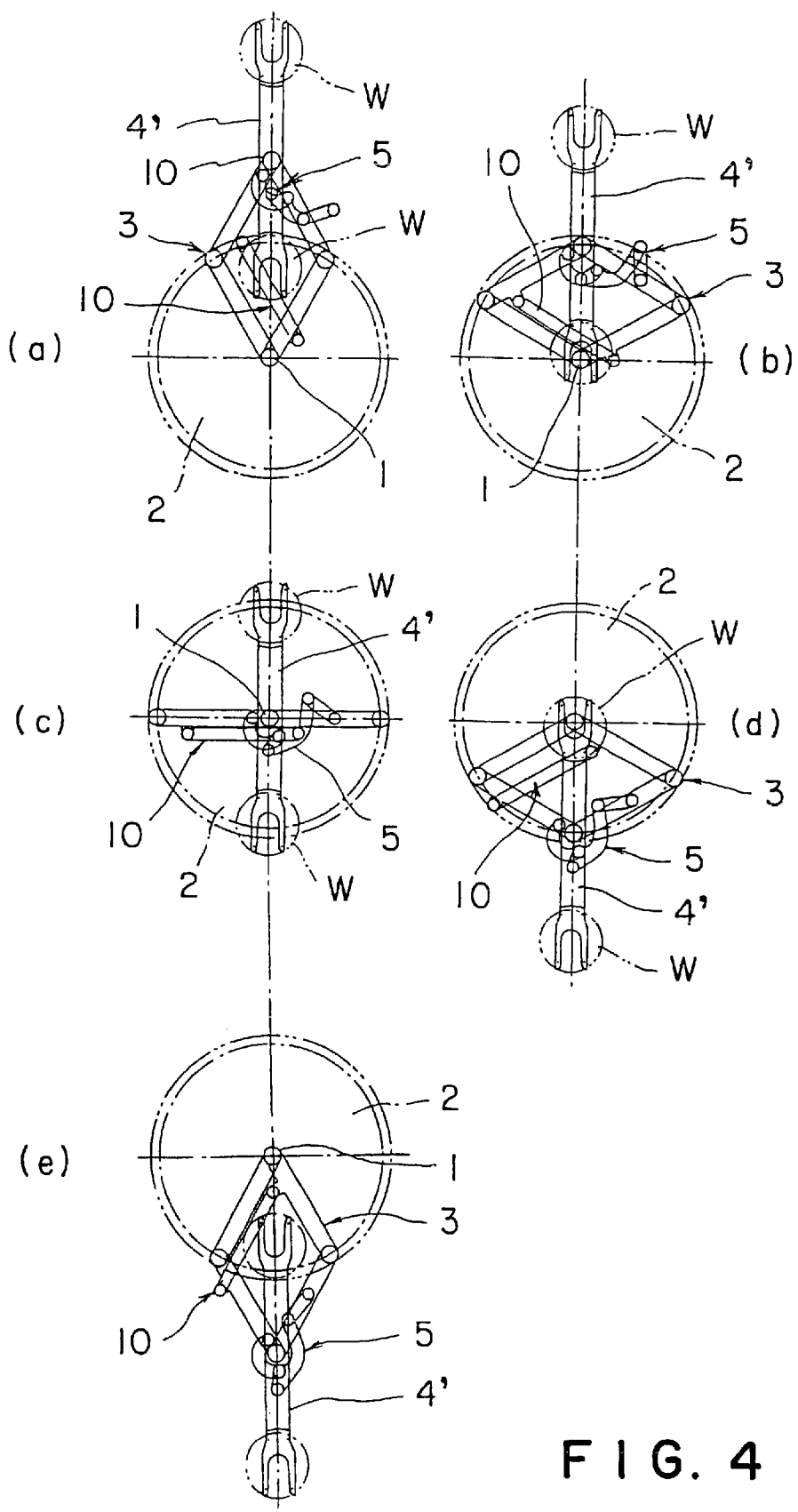
FIG. 4 is a diagrammatic view of assistance in explaining the operation of the carrying device shown in FIG. 3.

The operation of a carrying device capable of carrying two wafers at a time will be described with reference to FIG. 4. One of the holding parts of the wafer holder 4' receives a semiconductor wafer W with the frog leg type arm 3 extended straight as shown in FIG. 4(a) by the agency of the posture maintaining linkage 5. The first and the second drive shaft of the drive shaft 1 operates to contract the frog leg type arm 3 as shown in FIG. 4(b) and the wafer holder 4' moves straight backward from a position where the same has received the wafer W by the agency of the posture maintaining linkage 5.

As the drive shaft 1 operates further, the first and the second drive arm of the frog leg type arm 3 extend perpendicularly to the wafer holder 4' over the support member 2 as shown in FIG. 4(c), and the first and the second front arm are superposed on the first and the second drive arm. Since the uncontrollable and unstable point avoidance linkage 11 avoids an uncontrollable and unstable point, the frog leg type arm 3 extends in the opposite direction as shown in FIG. 4(d) by the agency of the uncontrollable and unstable point avoidance linkage 11 when the first drive arm 6A and the second drive arm 6B are driven, even if the first and the second front arms are superposed on the first and the second drive arm. Consequently, the wafer holder 4' moves straight in a direction opposite to the direction shown in FIG. 4(a) by the agency of the posture maintaining linkage 5 as shown in FIG. 4(d). Finally, the frog leg type arm 3 extends to a predetermined position to transfer the semiconductor wafer w as shown in FIG. 4(e).

Figure 5:
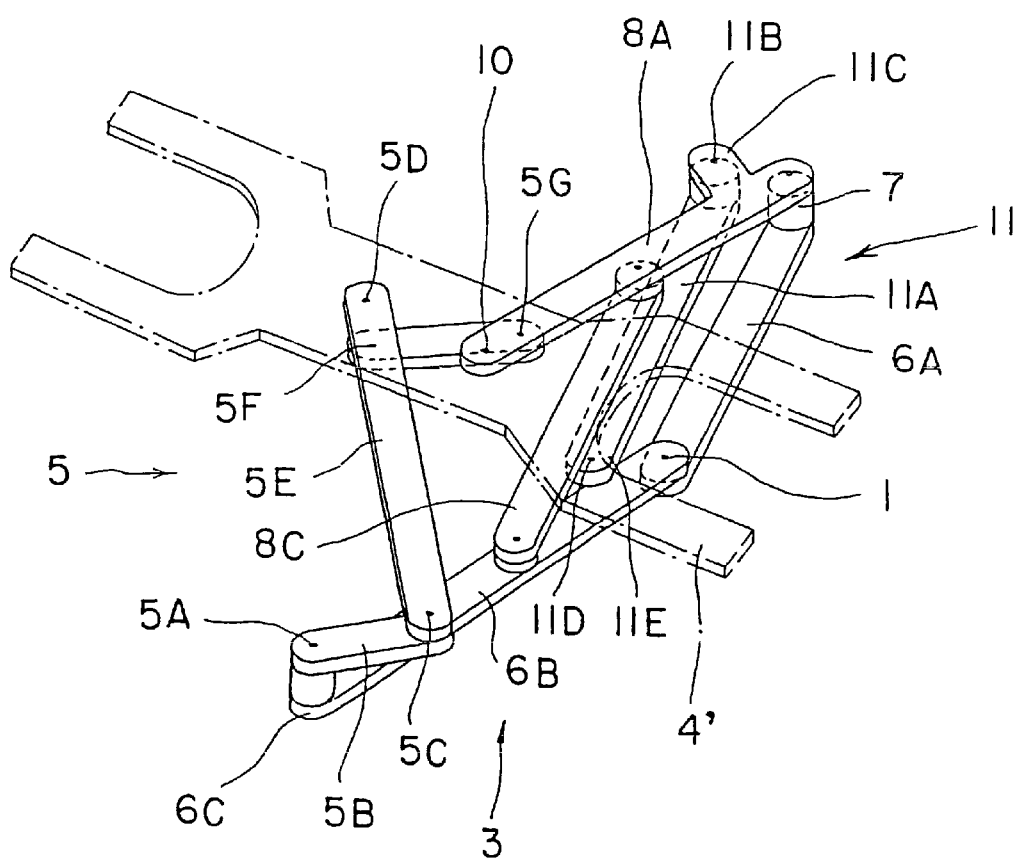
FIG. 5 is a perspective view of a carrying device provided with a frog leg type arm in a third embodiment according to the present invention.
Figure 6:
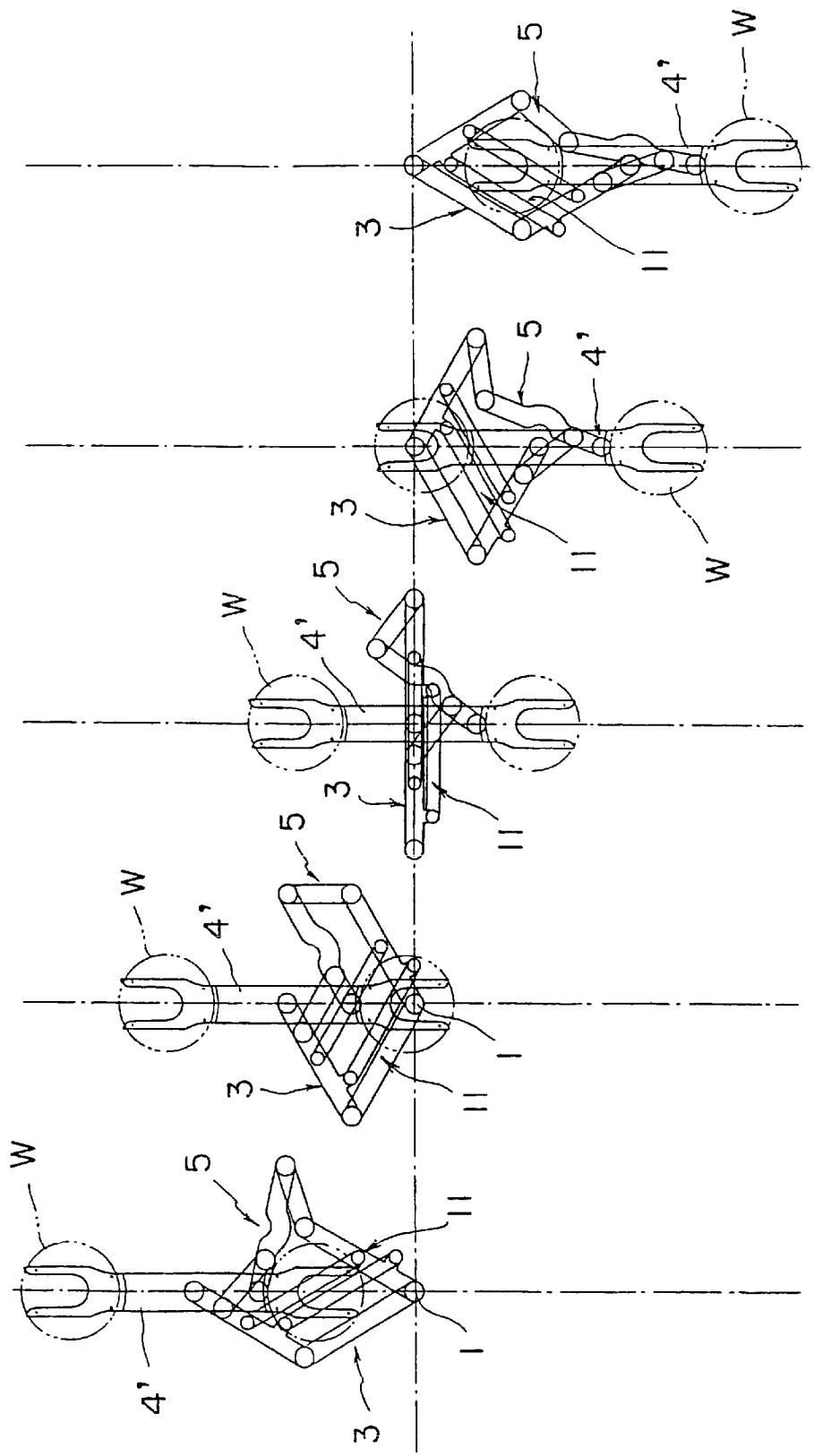
FIG. 6 is a diagrammatic view of assistance in explaining the operation of the carrying device shown in FIG. 5.

A carrying device in a third embodiment according to the present invention is shown in FIG. 5, in which parts like or corresponding to those of the carrying device in the second embodiment are denoted by the same reference characters. As shown in FIG. 5, the carrying device in the third embodiment is provided with an link 8C instead of the second front arm. The link 8C has one end pivotally connected to a middle part of a first front arm (hereinafter referred to as "front arm") 8A and the other end pivotally connected to a middle part of a second drive arm 6B. Since the third embodiment is not provided with any member corresponding to the second front arm, a pivot 5A included in a posture maintaining linkage 5 is connected to a front end part 6C of a second drive arm 6B instead of to the second arm. Thus a frog leg type arm 3 employed in the third embodiment is a first parallel linkage including a first drive arm 6A, a second drive arm 6B, the front arm 8A and the link 8C. Since the first drive arm 6A, the second drive arm 8B and the front arm 8A are the three sides of a rhombus, the distance between the front end part 6C of the second drive arm 6B and a joint 10 is invariable and the frog leg type arm 3 can be extended and contracted by driving the first drive arm 6A and the second drive arm 6B.

Even if the parallel linkage including the link 8C comes to an uncontrollable and unstable point, an uncontrollable and unstable point avoidance linkage 11 operates so that the front arm 8A may not become unrestrained, the frog leg type arm 3 is able to be extended smoothly according to the turning directions of the first drive arm 6A and the second drive arm 6B, a wafer holder 4' can be surely moved either forward or backward and the frog leg type arm 3 has a long stroke. Since a pivot 5A included in a posture maintaining linkage 5 is connected to the front end part 6C of the second drive arm 6B, the pivot 5A, pivots 5C and 5D and a joint 10 comprises a first antiparallel linkage. Therefore the posture maintaining linkage 5 maintains the wafer holder 4' always in a fixed posture so that the wafer holder 4' may move along a straight line without laterally swinging as the frog leg type arm 3 is extended and contracted. Thus, the wafer holder 4' can be surely moved either forward or backward as shown in FIGS. 6(a) to 6(e), so that a wafer can be accurately carried to a desired position. Since the frog leg type arm 3 is not provided with any member corresponding to the second front arm, a joint 10 attached to the wafer holder 4' may be thin, so that the wafer holder 4' can be passed through a narrower opening to carry a wafer.

As mentioned above, the first embodiment does not employ any steel belts and gears and is provided with the posture maintaining linkage 5. Therefore, the frog leg type arm 3 operates stably even in a hot, corrosive environment and is capable of accurately and surely carrying a semiconductor wafer W in a fixed posture to a desired position.

All the first drive arm 6A, the second drive arm 6B, the first front arm 8A and the second front arm 8B of the second embodiment shown in FIG. 3 have the same length and the uncontrollable and unstable point of the frog leg type arm 3 is avoided by the uncontrollable and unstable point avoidance linkage 11. Therefore the frog leg type arm 3 is able to extend and contract continuously forward and backward with respect to the support member 2. Therefore, the carrying device can be provided with the wafer holder 4' capable of holding two semiconductor wafers W as shown in FIG. 3 and is able to carry semiconductor wafers W efficiently. The second embodiment is capable of exercising the same functions and effects as those that can be exercised by the first embodiment.

The frog leg type arm 3 of the third embodiment shown in FIG. 5 is not provided with any member corresponding to the second front arm, and the joint 10 connected to the wafer holder 4' is thin. Therefore the frog leg type arm 3 of the third embodiment is able to carry wafers through a narrower opening. The third embodiment is capable of exercising the same functions and effects as those that can be exercised by the second embodiment.

Figure 7:
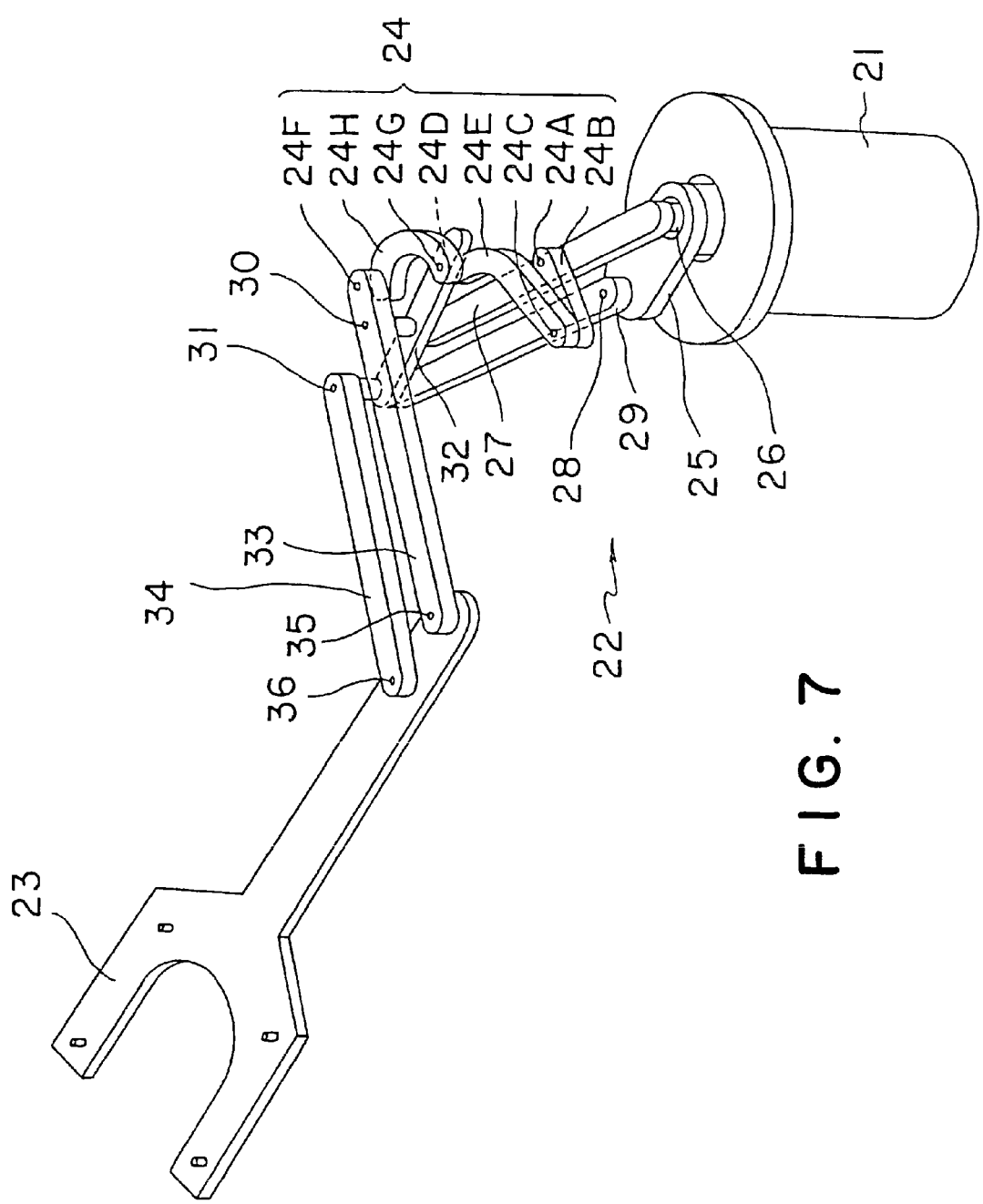
FIG. 7 is a perspective view of a carrying device provided with a parallel linkage type arm in a fourth embodiment according to the present invention.
Figure 8A:
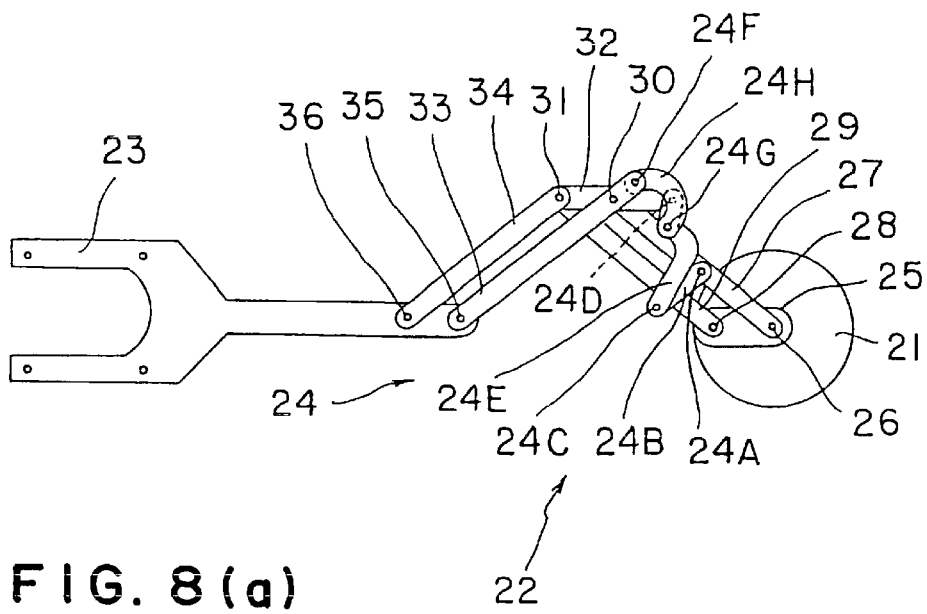
FIGS. 8(*a*) and 8(*b*) are a plan view and a side elevation of the carrying device shown in FIG. 7.
Figure 8B:
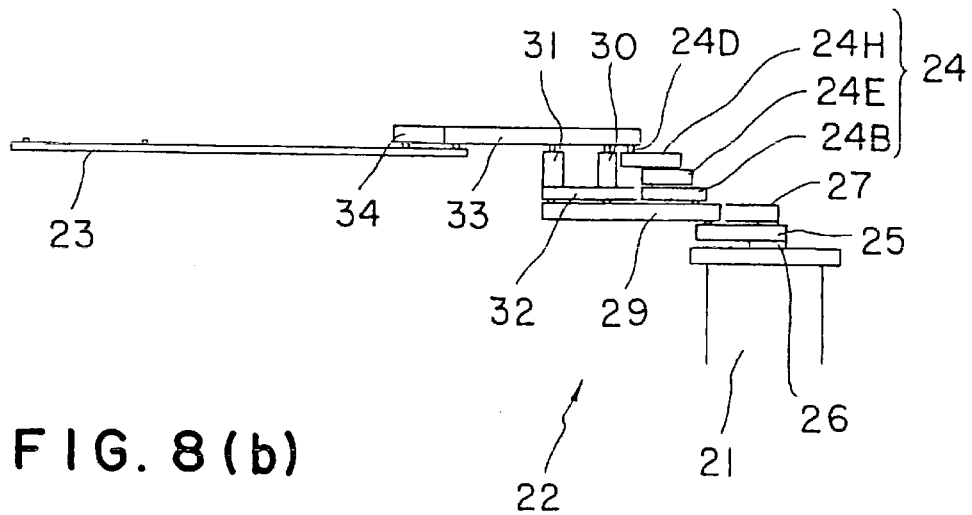
Figure 9:
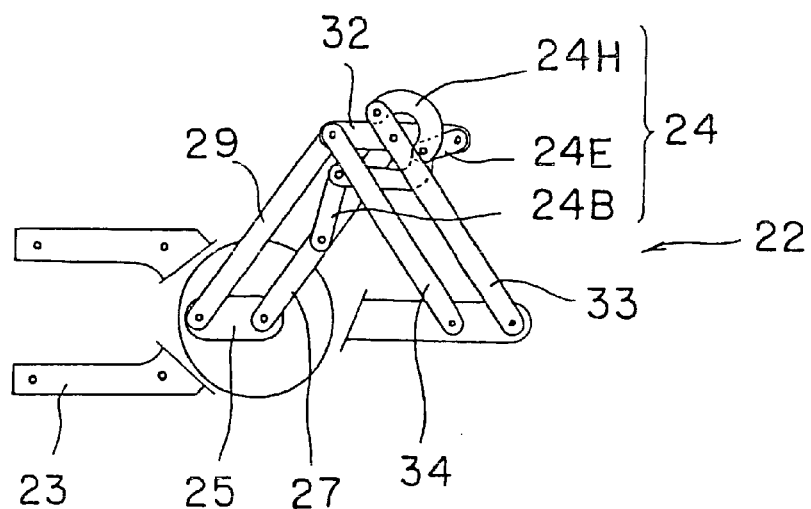
FIG. 9 is a plan view of the carrying device shown in FIG. 7 in a contracted state.

Referring to FIGS. 7 to 9, a carrying device in a fourth embodiment according to the present invention includes a drive shaft 26 formed by coaxially combining first and second drive shafts, not shown, (hereinafter referred to simply as "drive shaft"), a support member 21 supporting the drive shaft 26 in its central part and housing a driving device for driving the drive shaft 26, a parallel linkage type arm 22 having a base end part connected to the drive shaft 26 supported on the support member 21, a wafer holder 23 connected to a front end part of the parallel linkage type arm 22, and a posture maintaining linkage 24 for controlling the posture of the parallel linkage type arm 22 to maintain the wafer holder 23 always in a fixed posture. The first drive shaft of the drive shaft 26 is a hollow shaft and the second drive shaft is extended through the first drive shaft. The first and the second drive shaft are interlocked with a driving device and are driven for turning in the normal and the reverse direction. The parallel linkage type arm 22 is extended and contracted by turning the second drive shaft in the normal and the reverse direction. Turning the first and the second drive shaft in the same direction through the same angle can change the carrying direction of the parallel linkage type arm 22. When the carrying device in this embodiment is applied to a multichamber processing system, wafers can be carried into and carried out of a plurality of processing chambers.

Referring to FIGS. 7 to 9, the parallel linkage type arm 22 includes a shoulder link 25 having a base end part connected to the first drive shaft, a drive arm 27 having a base end part connected to the second drive shaft and capable of being turned in opposite directions, a driven arm 29 having a base end part joined to the other end of the shoulder link 25 by a joint 28 and capable of turning in opposite directions, an elbow link 32 having opposite end parts joined to the front end parts of the drive arm 27 and the driven arm 29 by a second joint 30 and a third joint 31, respectively, and capable of turning in opposite directions, a first front arm 33 having a base end part joined to the elbow link 32 by the second joint 30 and capable of turning in opposite directions, and a second front arm 34 having a base end part joined to the elbow link 32 by the third joint 31 and capable of turning in the opposite directions.

The wafer holder 23 is joined to the front end parts of the first front arm 33 and the second front arm 34 by a fourth joint 35 and a fifth joint 36 so as to be held in a horizontal position on a front end part of the parallel linkage type arm 22. In the fourth embodiment, the drive arm 27, the driven arm 29, the first front arm 33 and the second front arm 34 have the same length. The elbow link 32, the drive arm 27 and the first front arm 33 are interlocked by a posture maintaining linkage 24.

Referring to FIGS. 7 to 9, the posture maintaining linkage 24 includes a first link 24B having one end pivotally connected to a substantially middle part of the drive arm 27 by a pivot 24A, a second link 24E having one end pivotally connected to the other end of the first link 24B by a pivot 24C and the other end pivotally connected to a part of the elbow link 32 extending beyond the pivot 30 by a pivot 24D, and a third link 24H having one end pivotally connected to a part of the first front arm 33 extending beyond the second joint 30 by a pivot 24F and the other end pivotally connected to a part of the second link 24E by a pivot 24G.

Figure 10:
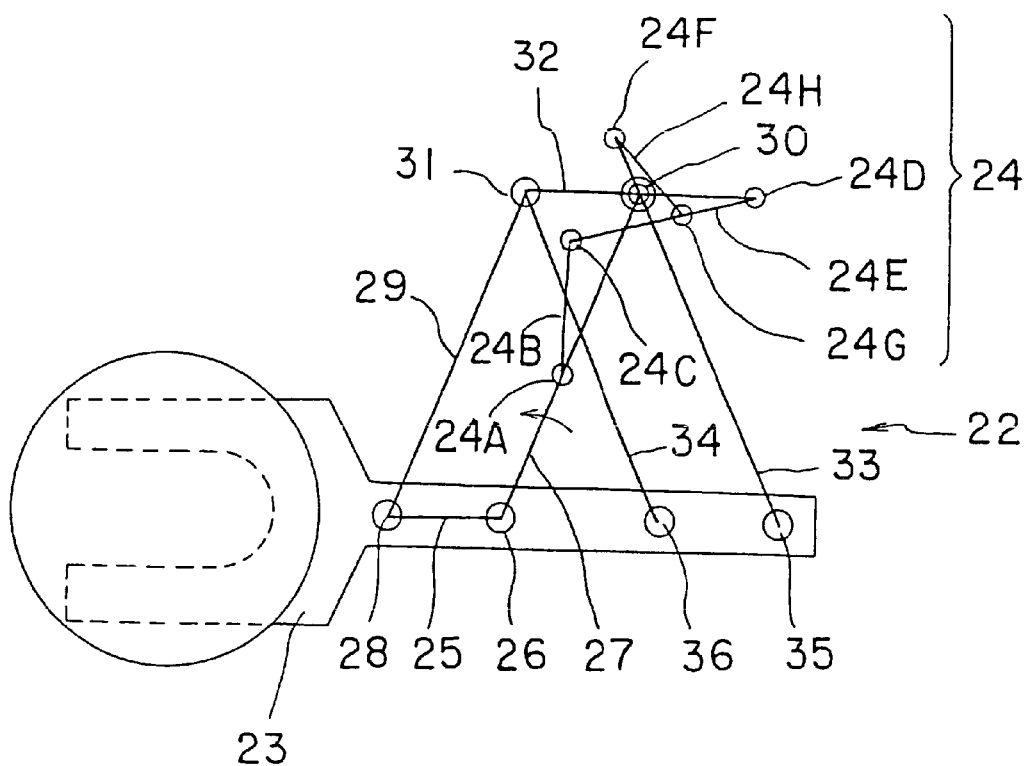
FIG. 10 is a diagrammatic view of assistance in explaining a linkage included in the carrying device shown in FIG. 9.

The posture maintaining linkage 24 will be described with reference to FIG. 10 showing the parallel linkage type arm 22 and the posture maintaining linkage 24 shown in FIG. 9. The parallel linkage type arm 22 has a first parallel linkage including the fixed shoulder link 25, the drive arm 27, the driven arm 29 and the elbow link 32, and a second parallel linkage including the elbow link 32, the first front arm 33, the second front arm 34 and a part of the wafer holder 23 between the joints 35 and 36.

In the posture maintaining linkage 24, the length of the first link 24B is equal to the distance between the second joint 30 and the pivot 24D, the length of the second link 24E is equal to the length of a part of the drive arm 27 between the second joint 30 and the pivot 24A, and the pivots 24A, 24C and 24D and the joint 30 comprises a first antiparallel linkage. The length of a part of the drive arm 27 between the second joint 30 and the pivot 24F is equal to that of a part of the second link 24E between the pivots 24D and 24G. The length of the third link 24H is equal to a part of the elbow link 32 between the second joint 30 and the pivot 24D. The pivots 24D, 24G and 24F and the joint 30 comprises a second antiparallel linkage. The ratio of the distance between the pivot 24A and the second joint 30 to the length of the first link 24B is equal to the ratio of the length of the third link 24H to the distance between the second joint 30 and the pivot 24F.

In the first antiparallel linkage, the angle between the links extending from the pivot 24A is equal to that between the links extending from the pivot 24D, and an angle between the links extending from the pivot 24C is equal to that between the links extending from the joint 30. In the second antiparallel linkage, the angle between the links extending from the pivot 24D is equal to that between the links extending from the pivot 24F and the angle between the links extending from the pivot 24G is equal to that between the links extending from the joint 30. Since the angle between the links extending from the pivot 24D of the first antiparallel linkage is equal to that between the links extending from the pivot 24D of the second antiparallel linkage, the first and the second antiparallel linkage are similar in shape and the corresponding angles between the corresponding link are always the same regardless of the position of the parallel linkage type arm 22. Thus, the angle between the links extending from the joint 30 of the first antiparallel linkage is always equal to that between the links extending from the joint 30 of the second antiparallel linkage. Therefore the elbow link 32 always bisects an angle between the drive arm 27 and the first front arm 33 regardless of the position of the parallel linkage type arm 22.

When the drive arm 27 is turned counterclockwise through an angle by the second drive shaft of the drive shaft 26, the first front arm 33 turns clockwise through the same angle based on the action of the posture maintaining linkage 24 because the elbow link 32 is restrained from turning by the first parallel linkage. Consequently, the wafer holder 23 moves along a straight line over the shoulder link 25 to carry a semiconductor wafer W accurately to a desired position on an extension of the shoulder link 25.

Figure 11:
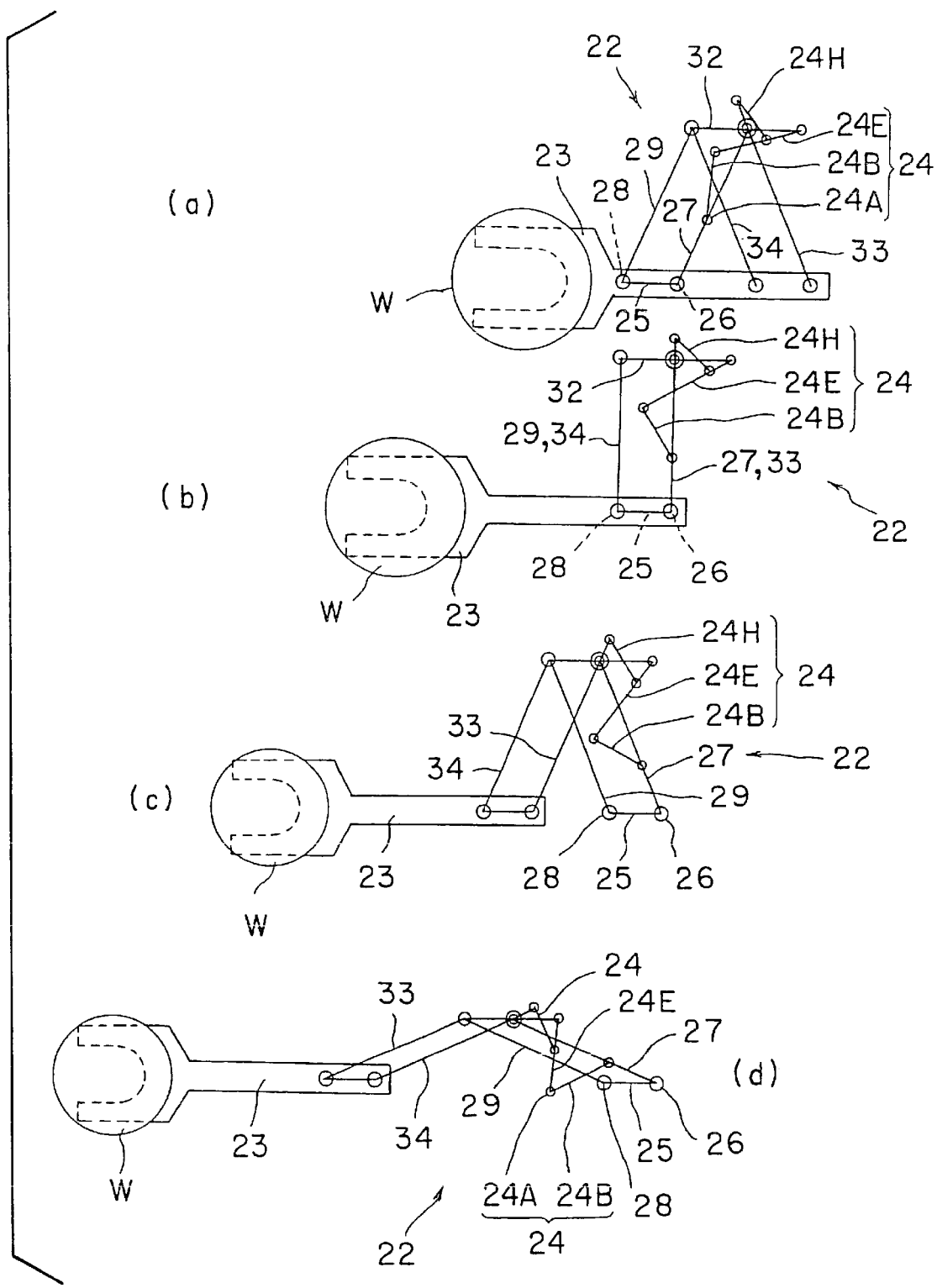
FIG. 11 is a diagrammatic view of assistance in explaining the operation of the carrying device shown in FIG. 9.

The operation will be described with reference to FIG. 11. As shown in FIG. 11(a), when the drive arm 27 and the driven arm 29 of the parallel linkage type arm 22 are turned counterclockwise by the second drive shaft of the drive shaft 26 from a state where the parallel linkage type arm 22 is moved to the right end of the support member, not shown in FIG. 11, by the action of the posture maintaining linkage 24, the first front arm 33 and the second front arm 34 are turned clockwise relative to the second link 32 by the action of the posture maintaining linkage 24. Consequently, the wafer holder 23 is moved to the left along a straight line from a position shown in FIG. 11(a), and the first front arm 33 and the second front arm 34 overlap the drive arm 27 and the driven arm 29, and the joints 35 and 36 of the wafer holder 23 overlie the drive shaft 26 and the joint 28 as shown in FIG. 11(b).

As the drive shaft 1 rotates further, the drive arm 27 and the driven arm 29 turn counterclockwise, the first front arm 33 and the second front arm 34 are turned clockwise by the action of the posture maintaining linkage, the wafer holder 23 is moved along a straight line past the shoulder link 25 as shown in FIG. 11(c) to a wafer transfer position shown in FIG. 11(d) to transfer a semiconductor wafer W to a wafer receiving member.

As apparent from the foregoing description, since the drive arm 27 of the parallel linkage type arm 22, the elbow link 32 and the first front arm 33 are interlocked by the posture maintaining linkage 24 in the carrying device in the fourth embodiment, the wafer holder 23 is able to operate stably in a hot, corrosive environment, moves always along the straight line extending over the shoulder link 25 always in a fixed posture and is able to carry the semiconductor wafer W accurately to a desired position.

The present invention may be embodied by frog leg type carrying devices shown in FIGS. 12 to 15. The frog leg type carrying devices shown in FIGS. 12 to 15 are capable of exercising the same functions and effects as those exercised by the carrying devices in the first and the second embodiment.

Figure 12:
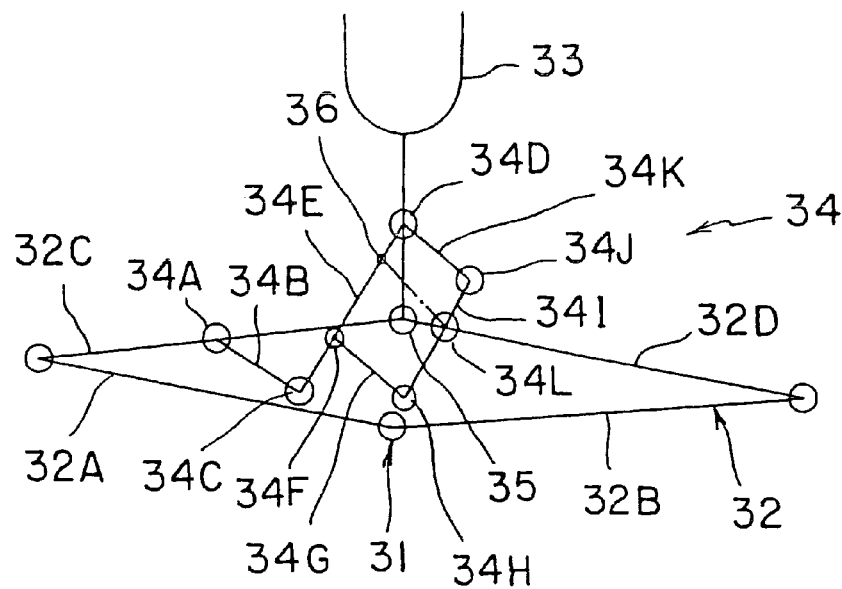
FIG. 12 is a diagrammatic view, similar to FIG. 2, of a carrying device provided with a frog leg type arm in a fifth embodiment according to the present invention.

The carrying device shown in FIG. 12 includes a frog leg type arm 32, a wafer holder 33, and a posture maintaining linkage 34 interconnecting the wafer holder 33 and the frog leg type arm 32. The frog leg type arm 32 includes a first drive arm 32A, a second drive arm 32B, a first front arm 32C and a second front arm 32D. The frog leg type arm 32 is connected to the wafer holder 33 by a joint 35.

As shown in FIG. 12, the posture maintaining linkage 34 includes a first link 34B having one end part pivotally connected to the first front arm 32C by a pivot 34A, a second link 34E having one end part pivotally connected to the other end part of the first link 34B by a pivot 34C and the other end part pivotally connected to a part of the wafer holder 33 on an extended line of a joint 35 on the wafer holder 33 by a pivot 34D, a third link 34G having one end part pivotally connected to a middle part of the second link 34E by a pivot 34F, a fourth link 34I having one end part pivotally connected to the other end part of the third link 34G by a pivot 34H and extending in parallel to the second link 34E, and a fifth link 34K having one end part pivotally connected to the other end part of the fourth link 34I by a pivot 34J and the other end part pivotally connected to the wafer holder 33 by a pivot 34D and extending in parallel to the third link 34G. The fourth link 34I is connected pivotally to the second front arm 32D by a pivot 34L.

The length of the first link 34B is equal to the distance between the pivot 34D and the joint 35, the length of the second link 34E is equal to the distance between the pivot 34A and the joint 35, and the pivots 34A, 34C and 34D and the joint 35 comprises a first antiparallel linkage. The distance between the pivot 34D and the joint 35 is equal to the distance between the pivot 34L and a point 36 on the second link 34E where a line (chain line) extending from the pivot 34L in parallel to the fifth link 34K intersects the second link 34E, the distance between the pivot 34D and the point 36 is equal to the distance between the pivot 34L and the joint 35, and the pivot 34D, the point 36, the pivot 34L and the joint 35 comprises a second antiparallel linkage. The ratio of the length of the second link 34E to that of the first link 34B is equal to the ratio of the distance between the pivot 34D and the joint 35 to the distance between the pivot 34D and the point 36. The angle between the second link 34E and a line segment between the pivot 34D and the joint 35 is common to the first and the second antiparallel linkage. Thus, the first and the second antiparallel linkage are always similar in shape and the angle between the links extending from the joint 35 of the first antiparallel linkage is equal to that between the links extending from the joint 35 of the second antiparallel linkage regardless of the condition of the frog leg type arm 32. Thus a line connecting the pivot 34D of the wafer holder 33 and the joint 35 always bisects the angle between the first front arm 32C and the second front arm 32D, and the wafer holder 33 is maintained always in a fixed posture without being turned laterally.

Figure 13:
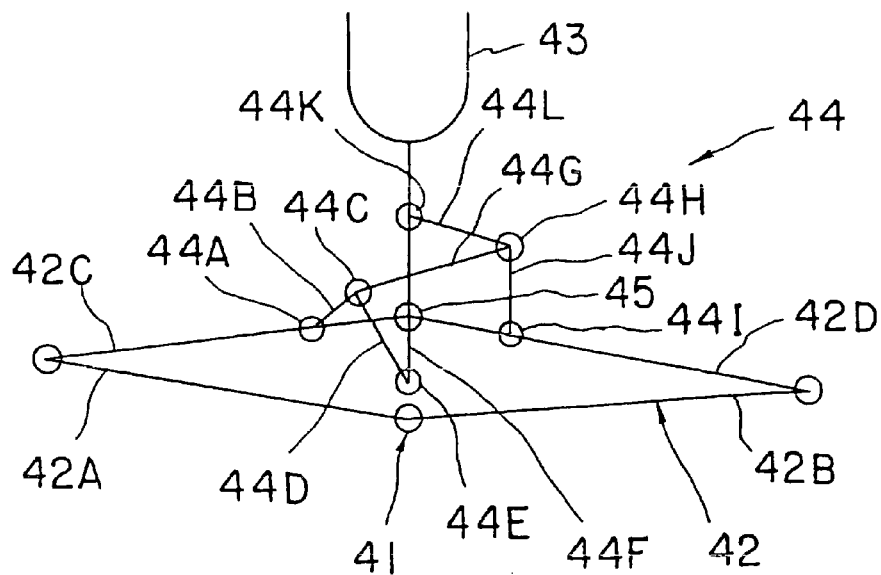
FIG. 13 is a diagrammatic view, similar to FIG. 2, of a carrying device provided with a frog leg type arm in a sixth embodiment according to the present invention.

The carrying device shown in FIG. 13 includes a frog leg type arm 42, a wafer holder 43, and a posture maintaining linkage 44 interconnecting the wafer holder 43 and the frog leg type arm 42. The frog leg type arm 42 includes a first drive arm 42A, a second drive arm 42B, a first front arm 42C and a second front arm 42D. The frog leg type arm 42 is connected to the wafer holder 43 by a joint 45.

As shown in FIG. 13, the posture maintaining linkage 44 includes a first link 44B having one end part pivotally connected to the first front arm 42C by a pivot 44A, a second link 44D having one end part pivotally connected to the other end part of the first link 44B by a pivot 44C, a third link 44F, which is a part of a base part of the wafer holder 43 extending on a center axis on the side of the back end of the wafer holder 43 with respect to the joint 45 or an extension of the wafer holder 43, having one end part pivotally connected to the other end part of the second link 44D by a pivot 44E and the other end part connected to the joint 45, a fourth link 44G having one end part pivotally connected to the other end part of the first link 44B by a pivot 44C, a fifth link 44J having one end part pivotally connected to the other end part of the fourth link 44G by a pivot 44H and the other end connected to a pivot 44I on the second front arm 42D, and a sixth link 44L having one end part connected to the pivot 44H pivotally connecting the fourth link 44G and the fifth link 44J and the other end part connected to a pivot 44K disposed on a line passing the joint 45 of the wafer holder 43. The pivots support all the links pivotally.

The length of the first link 44B is equal to that of the third link 44F, the length of the second link 44D is equal to the distance between the pivot 44A of the first front arm 42C and the joint 45, and the pivots 44A, 44C and 44E and the joint 45 comprises a first antiparallel linkage. The length of the second link 44D is equal to that of the fifth link 44L, the length of the fourth link 44G is equal to the distance between the pivot 44E in the base end part of the wafer holder 43 and the pivot 44K, and the pivots 44C, 44E, 44K and 44H comprises a second antiparallel linkage. The ratio of the length of the second link 44D to that of the first link 44B is equal to the ratio of the length of the fourth link 44G to that of the second link 44D. The angle between the second link 44D and a line segment between the pivot 44E and the joint 45 is common to the first and the second antiparallel linkage. Thus, the first and the second antiparallel linkage are always similar in shape regardless of the condition of the frog leg type arm 42. Lines connecting the pivots 44I, 44H and 44K and the joint 45 form a parallelogram. Thus, the angle between the links extending from the joint 35 of the first antiparallel linkage is always equal to the angle between the links extending from the pivot 44K of the second antiparallel linkage, the angle between the links extending from the pivot 44K and that between the second front arm 42D and a line segment between the pivot 44E and the joint 45, and the angle between the second front arm 42D and a line segment between the pivot 44E and the joint 45 is equal to that between the links extending from the joint 45 of the first antiparallel linkage. Therefore a line connecting the pivots 44E and 44K always bisects the angle between the first front arm 42C and the second front arm 42D, and the wafer holder 43 is maintained always in a fixed posture without being turned laterally.

Figure 14:
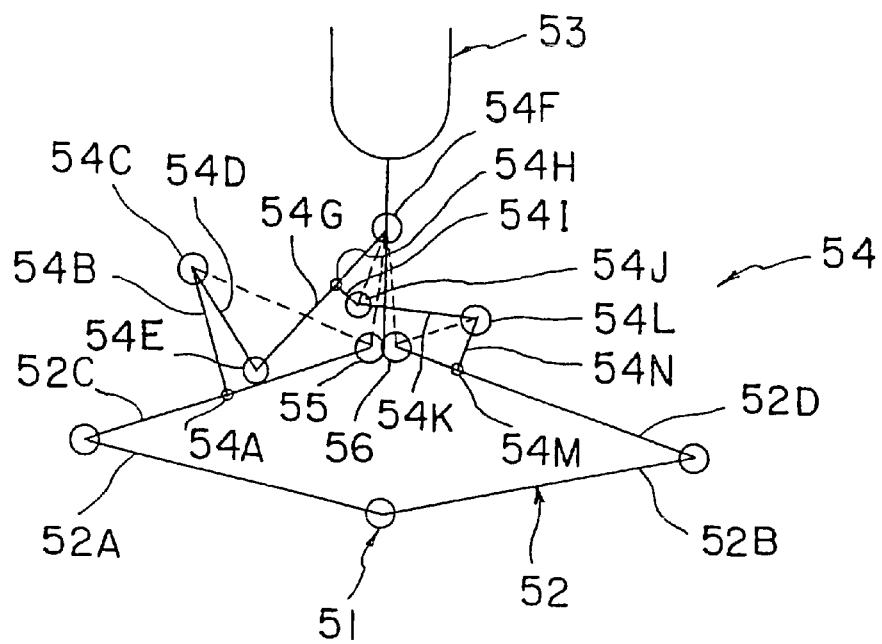
FIG. 14 is a diagrammatic view, similar to FIG. 2, of a carrying device provided with a frog leg type arm in a seventh embodiment according to the present invention.

The carrying device shown in FIG. 14 includes a frog leg type arm 52, a wafer holder 53, and a posture maintaining linkage 54 interconnecting the wafer holder 53 and the frog leg type arm 52. The frog leg type arm 52 includes a first drive arm 52A, a second drive arm 52B, a first front arm 52C and a second front arm 52D. The frog leg type arm 52 is connected to the wafer holder 53 by joints 55 and 56 disposed on a line perpendicular to the length of the base end part of the wafer holder 53.

As shown in FIG. 14, the posture maintaining linkage 54 includes a first fixed link 54B having one end part connected to the first front arm 52C by a fixed shaft 54A, a first link 54D having one end part pivotally connected to the other end part of the first fixed link 54B by a pivot 54C, a second link 54G having one end part pivotally connected to the other end part of the first link 54D by a pivot 54E and the other end connected to a pivot 54F disposed on a base end part of the wafer holder 53 at one of the vertices including joints 55 and 56 of an isosceles triangle, a second fixed link 54I connected to a fixed shaft 54H disposed on the second link 54G, a third link 54K having one end part pivotally connected to the other end of the second fixed link 54I by a pivot 54J, and a third fixed link 54N having one end part pivotally connected to the other end of the third link 54K by a pivot 54L and the other end part connected to a fixed shaft 54M on the second front arm 52D.

The length of the first link 54D is equal to the distance between the pivot 54F and the joint 55 of the wafer holder, the length of the second link 54G is equal to the distance of a line segment between the pivot 54C and the joint 55 indicated by a broken line, and the pivots 54C, 54E and 54F and the joint 55 comprises a first antiparallel linkage. The length of the third link 54K is equal to the length of a line segment between the pivot 54F and the joint 56 indicated by a broken line, the length of a line segment between the pivots 54F and 54J indicated by a broken line is equal to that of a line segment between the pivot 54L and the joint 56 indicated by a broken line, and the pivots 54F, 54J and 54L and the joint 56 comprises a second antiparallel linkage. The ratio of the length of the second link 54G to that of the first link 54D is equal to the ratio of the length of the third link 54K to the distance between the pivots 54F and 54J. Although the first and the second antiparallel linkage do not have any angle in common, the first and the second antiparallel linkage are always similar in shape regardless of the condition of the frog leg type arm 52 because the length of the second fixed link 54I and the distance between the joints 55 and 56 are determined such that the angle between the links extending from the pivot 54 of the first antiparallel linkage is equal to that between the links extending from the pivot 54F of the second antiparallel linkage. Thus, the angle between the links extending from the joint 55 of the first antiparallel linkage is always equal to the angle between the links extending from the joint 56 of the second antiparallel linkage and the wafer holder 53 is maintained always in a fixed posture without being turned laterally.

Figure 15:
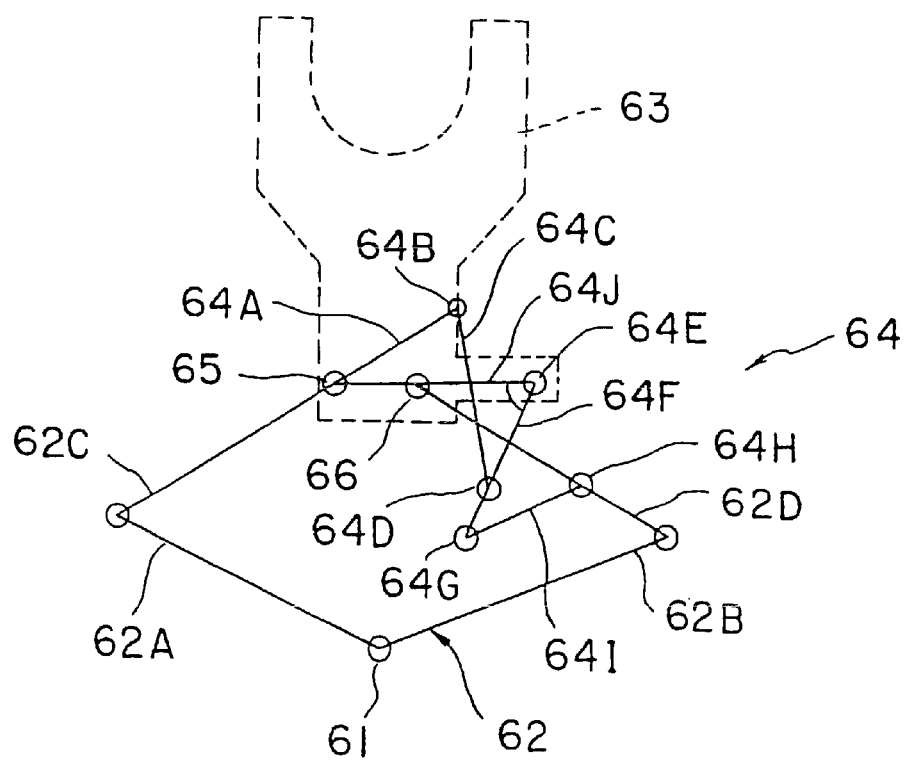
FIG. 15 is a diagrammatic view, similar to FIG. 2, of a carrying device provided with a frog leg type arm in an eighth embodiment according to the present invention.

The carrying device shown in FIG. 15 includes a drive shaft 61 of coaxial construction, a frog leg type arm 62, a wafer holder 63 and a posture maintaining linkage interconnecting the wafer holder 63 and the frog leg type arm 62. The frog leg type arm 62 includes a first drive arm 62A, a second drive arm 62B, a first front arm 62C and a second front arm 62D. The frog leg type arm 62 is connected to the wafer holder 63 by joints 65 and 66 disposed side by side on a line perpendicular to the length of a base end part of the wafer holder 63.

As shown in FIG. 15, the posture maintaining linkage 64 includes a first link 64A (an extension of the first front arm 62C) having one end part connected to the joint 65, a second link 64C having one end part pivotally connected to the other end part of the first link 64A by a pivot 64B, a third link 64F having a part pivotally connected to the other end part of the second link 64C by a pivot 64D and having one end part connected to a pivot 64E on the wafer holder 63, and a fourth link 64I having one end part pivotally connected to the other end part of the third link 64F by a pivot 64G and the other end part pivotally connected to the second front arm 62D by a pivot 64H. The pivot 64E is disposed on an extension of a line segment between the joints 65 and 66. All the links are capable of turning on the pivots.

The length of the first link 64A is equal to the distance between the pivots 64D and 64E on the third link 64F, the length of the second link 64C is equal to the distance between the joint 65 and the pivot 64E, and the joint 65 and the pivots 64B, 64D and 64E comprises a first antiparallel linkage. The length of the fourth link 64I is equal to the distance between the joint 66 and the pivot 64E, the length of the third link 64F is equal to the distance between the joint 66 and the pivot 64H on the second front arm 62D, and the joint 66 and the pivots 64E, 64G and 64H comprises a second antiparallel linkage. The ratio of the length of the second link 64C to that of the first link 64A is equal to the ratio of the length of the third link 64F to that of the fourth link 64I. The angle between a line segment between the joint 66 and the pivot 64E, and the third link 64F is common to the first and the second antiparallel linkage. Therefore the first and the second antiparallel linkage are always similar in shape regardless of the condition of the frog leg type arm 62. Thus the angle between the links extending from the joint 65 of the first antiparallel linkage is always equal to that between the links extending from the joint 66 of the second antiparallel linkage and the wafer holder 63 is maintained always in a fixed posture without being turned laterally.

Figure 16:
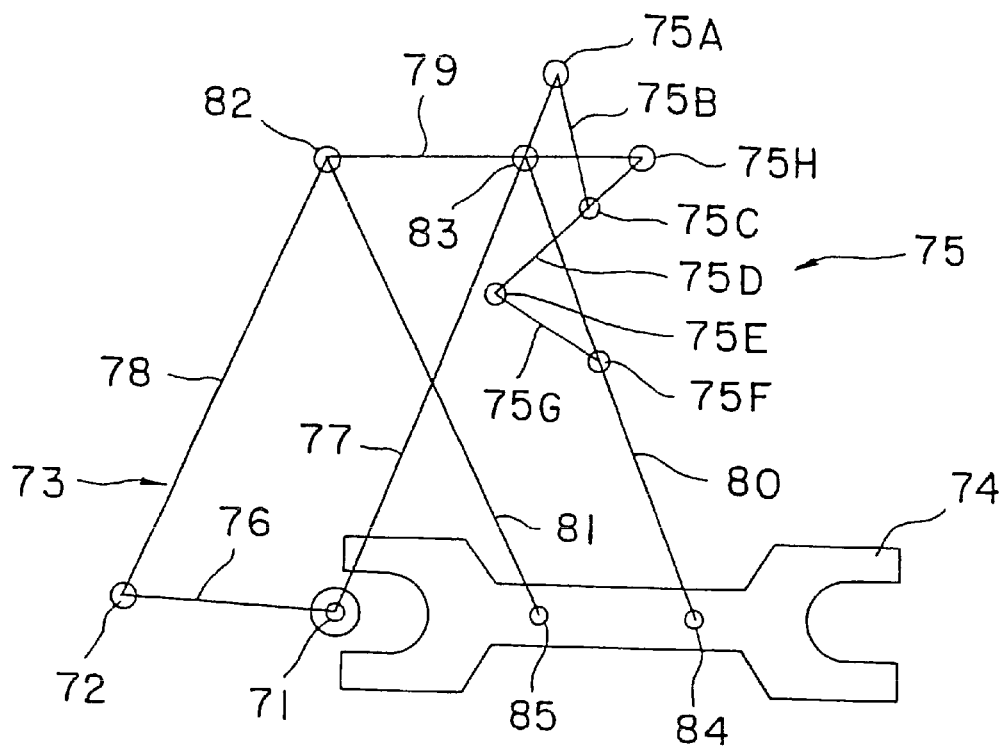
FIG. 16 is a diagrammatic view, similar to FIG. 2, of a carrying device provided with a parallel linkage type arm in a ninth embodiment according to the present invention.
Figure 17:
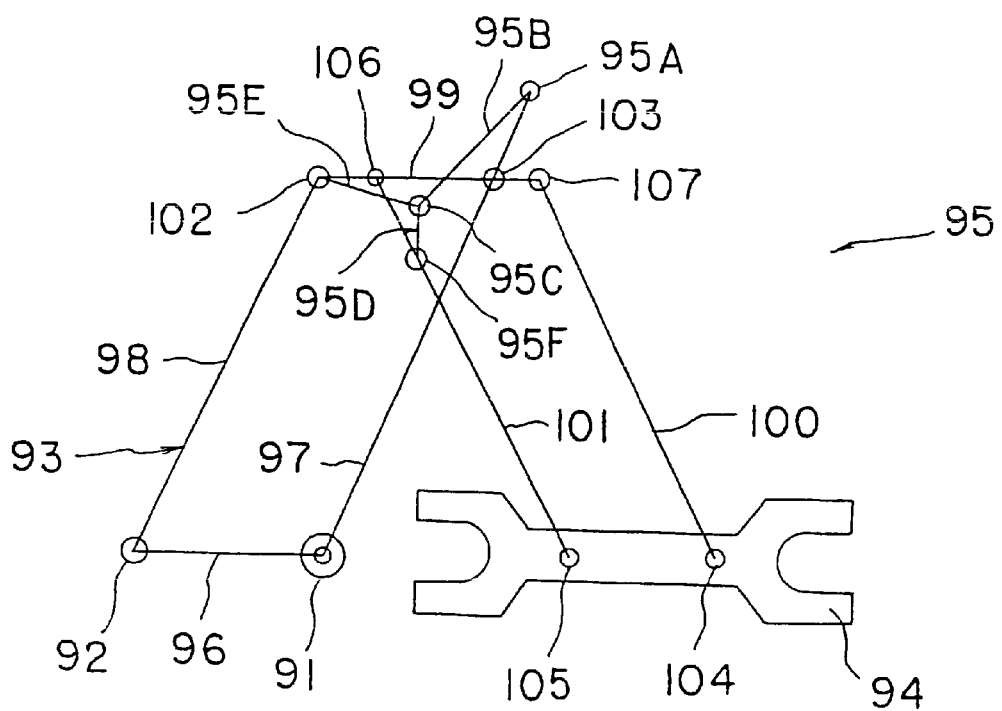
FIG. 17 is a diagrammatic view, similar to FIG. 2, of a carrying device provided with a parallel linkage type arm in a tenth embodiment according to the present invention.

The present invention may be embodied by a parallel linkage type carrying devices shown in FIGS. 16 and 17. The same functions and effects as those may be exercised by the fourth embodiment can be expected of the carrying devices shown in FIGS. 16 and 17.

The carrying device shown in FIG. 16 includes a parallel linkage type arm 73 having a base end part mounted on a drive shaft 71 supported on a support member, not shown, a wafer holder 74 for holding a semiconductor wafer W, connected to a front end part of the parallel linkage type arm 73, and a posture maintaining linkage 75 for controlling the posture of the parallel linkage type arm 73 to maintain the wafer holder 74 always in a fixed posture. The carrying device shown in FIG. 16 is the same in construction as the carrying device shown in FIG. 5, except that the former differs from the latter only in the positional relation between the wafer holder 74 and the posture maintaining linkage 75. The wafer holder 74 is capable of holding two semiconductor wafers, and the parallel linkage type arm 73 supports the wafer holder 74 in the same manner as that shown in FIG. 5.

As shown in FIG. 16, the parallel linkage type arm 73 includes a shoulder link 76, a drive arm 77, a driven arm 78, an elbow link 79, a first front arm 80 and a second front arm 81, which are connected by joints 82 to 85 as shown in FIG. 16.

The posture maintaining linkage 75 shown in FIG. 16 includes a first link 75B having one end part pivotally connected to an extension of a drive arm 77 by a pivot 75A, a second link 75D having a part pivotally connected to the other end part of the first link 75B by a pivot 75C, and a third link 75G having one end part pivotally connected to one end part of the second link 75D by a pivot 75E and the other end part pivotally connected to a first front arm 80 by a pivot 75F. The other end of the second link 75D is connected to an extension of an elbow link 79 by a pivot 75H.

In the posture maintaining linkage 75, the length of the first link 75B is equal to the distance between the joint 83 and the pivot 75H on the elbow link 79, the distance between the joint 83 and the pivot 75A on the drive arm 77 is equal to that between the pivots 75C and 75H on the second link 75D, and the pivots 75A, 75C and 75H and the joint 83 comprises a first antiparallel linkage. The length of the third link 75G is equal to the distance between the joint 83 and the pivot 75H on the elbow link 79, the length of the second link 75D is equal to the distance between the joint 83 and the pivot 75F on the first front arm 80, and the pivots 75H, 75E and 75F and the joint 83 comprises a second antiparallel linkage. The ratio of the distance between the joint 83 and the pivot 75A on the drive arm 77 to the length of the first link 75B is equal to the ratio of the length of the third link 75G to that of the second link 75D. The angle between the links extending from the pivot 75H is common to the first and the second antiparallel linkage. Therefore all the corresponding angles of the first and the second antiparallel linkage are equal to each other and the first and the second antiparallel linkage are always similar in shape. When the drive arm 77 is turned counterclockwise by the second drive shaft of the drive shaft 71, the wafer holder 74 is moved along a straight line over the shoulder link 76 by the agency of the posture maintaining linkage 75 and the wafer holder 74 is able to carry a semiconductor wafer W accurately to a desired position.

Parts of the carrying device shown in FIG. 17 like or corresponding to those of the carrying device shown in FIG. 16 are denoted by reference numerals greater by twenty than reference numerals denoting the corresponding parts shown in FIG. 16 and the description thereof will be omitted. Only a posture maintaining linkage 95 included in the carrying device shown in FIG. 17 will be described. In a parallel linkage type arm 93 shown in FIG. 17, a first front arm 100 and a second front arm 101 are not linked directly to a drive arm 97 and a driven arm 98, and are linked to right-hand parts of an elbow link 99 by joints 106 and 107.

As shown in FIG. 17, the posture maintaining linkage 95 includes a first link 95B having one end part connected to an extension of the drive arm 97 by a pivot 95A, a second link 95D having one end part connected to the other end part of the first link 95B by a pivot 95C, and a third link 95E having one end part connected to the other end part of the first link 95B by the pivot 95C. The other end part of the second link 95D is connected to the front arm 101 by a pivot 95F, and the other end part of the third link 95E is connected to the elbow link 99 by a joint 102.

The length of the first link 95B is equal to the distance between the joint 102 and a joint 103 on the elbow link 99, the length of the third link 95E is equal to the distance between the joint 103 and the pivot 95A on the drive arm 97, and the pivots 95A and 95C and the joints 102 and 103 comprises a first antiparallel linkage. The length of the second link 95D is equal to the distance between the joint 102 and a joint 106 on the elbow link 99, the length of the third link 95E is equal to the distance between the joint 106 and the pivot 95F on the second front arm 101, and the pivots 95C and 95F and the joints 102 and 106 comprises a second antiparallel linkage. The ratio of the length of the third link 95E to that of the first link 95B is equal to the ratio of the length of the second link 95D to that of the third link 95E. The angle between the links extending from the joint 102 is common to the first and the second antiparallel linkage. Therefore all the corresponding angles of the first and the second antiparallel linkage are equal to each other and the first and the second antiparallel linkage are always similar in shape. When the drive arm 97 is turned counterclockwise by the second drive shaft of a drive shaft 91, a wafer holder 94 is moved along a straight line over a shoulder link 96 by the agency of the posture maintaining linkage 95 and a wafer holder 94 is able to carry a semiconductor wafer W accurately to a desired position.

The present invention is not limited in its practical application to the carrying devices provided with the frog leg type arm or the parallel linkage type arm in the preferred embodiments specifically described herein. The present invention includes all the carrying devices provided with two antiparallel linkages as a posture maintaining linkage and those provided with a posture maintaining linkage not provided with two practical antiparallel linkages, but provided with two virtual antiparallel linkages formed by fixing the distance between two points to form a virtual link by another parallel linkage or a curved fixed link employed in the carrying devices shown in FIGS. 12 and 14.

What is claimed is:

1. A carrying device comprising:
    a support member;
    first and second shafts supported on the support member;
    a frog leg type arm having a base end part connected to the first and the second shaft; and
    a holding member for holding a workpiece, connected to a front end part of the frog leg type arm;
    wherein the frog leg type arm comprises:
        a rotatable first drive arm having a base end part mounted on the first shaft,
        a rotatable second drive arm having a base end part mounted on the second shaft,
        a first front arm having a base end part pivotally connected to a front end part of the first drive arm by a first joint and
        a second front arm having a base end part pivotally connected to a front end part of the second drive arm by a second joint;
    the holding member is connected by third and fourth joints to front end parts of the first and the second front arm;
    the holding member is linked to the first and the second front arm by a posture maintaining linkage having two similar antiparallel linkages, and the posture maintaining linkage controls turning of the holding member relative to the first and the second front arm.

2. A carrying device according to claim 1, wherein the first and the second shaft are coaxial, the third and the fourth joint are coaxial,
    the first and the second drive arm and the first and the second front arm have the same length,
    a parallel linkage is formed by connecting opposite end parts of a links disposed opposite to the first drive arms to the first front arm and the second drive arm, and
    the parallel linkage has an uncontrollable and unstable point at a position other than a position where the coaxial third and fourth joints overlap the coaxial first and the second shaft.

3. A carrying device according to claim 2, wherein the holding member is provided with workpiece holding parts at its opposite ends, and a joint is disposed at a middle point between the workpiece holding parts.

4. A carrying device comprising:
    a support member;
    first and second shafts coaxially supported on the support member;
    a frog leg type arm having a base end part connected to the first and the second shaft; and
    a holding member for holding a workpiece, connected to a front end part of the frog leg type arm;
    wherein the frog leg type arm comprises:
        a rotatable first drive arm having a base end part mounted on the first shaft,
        a rotatable second drive arm having a base end part mounted on the second shaft,
        a front arm having a base end part pivotally connected by a first joint to a front end part of the first drive arm and
        two links extended in parallel to the first drive arm and having opposite end parts connected to the front arm and the second drive arm;
    the first and the second drive arm, the front arm and the two links have the same length, and the first and the second drive arm, the front arm and the two links form two parallel linkages;
    the two parallel linkages have different uncontrollable and unstable points, respectively, and the first and the second drive arm and the front arm form three sides of a rhombus;
    the holding member is pivotally connected to a front end part of the front arm by a second joint; and
    the front arm, a front end part of the second drive arm and the holding member are linked by a posture maintaining linkage having two similar antiparallel linkages, and the posture maintaining linkage controls the turning of the holding member relative to the front arm.

5. A carrying device according to claim 4, wherein the holding member is provided with workpiece holding parts at its opposite ends, and a joint is disposed at a middle point between the workpiece holding parts.

6. A carrying device comprising:
    a support member;
    a parallel linkage type arm having a base end part supported on the support member; and
    a holding member for holding a workpiece, connected to a front end part of the parallel linkage type arm;

wherein the parallel linkage type arm comprises:
a first link fixed to the support member,
a rotatable drive arm having a base end part mounted on a drive shaft penetrating an end part of the first link,
a driven arm having a base end part pivotally connected to the other end of the first link by a first joint,
a second link pivotally connected to front end parts of the drive arm and the driven arm by second and third joints, respectively, and
first and second front arms having base end parts pivotally connected to the second link;

the holding member is connected pivotally to front end parts of the first and the second front arm by fourth and fifth joints; and the drive arm or the driven arm, the second link, and the first or the second front arm are linked by a posture maintaining linkage having two similar antiparallel linkages, and the posture maintaining linkage makes the holding member move along a straight line.

* * * * *